(12) United States Patent
Sawatari et al.

(10) Patent No.: US 8,988,885 B2
(45) Date of Patent: *Mar. 24, 2015

(54) ELECTRONIC CIRCUIT MODULE AND METHOD FOR PRODUCING THE SAME

(71) Applicant: Taiyo Yuden Co., Ltd., Tokyo (JP)

(72) Inventors: Tatsuro Sawatari, Tokyo (JP); Masashi Miyazaki, Tokyo (JP); Yoshiki Hamada, Tokyo (JP); Yuichi Sugiyama, Tokyo (JP); Kazuaki Ida, Gunma (JP)

(73) Assignee: Taiyo Yuden Co., Ltd, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/073,287

(22) Filed: Nov. 6, 2013

(65) Prior Publication Data

US 2014/0126157 A1 May 8, 2014

(30) Foreign Application Priority Data

Nov. 7, 2012 (JP) .................................. 2012-245166
Sep. 18, 2013 (JP) .................................. 2013-192505

(51) Int. Cl.
*H05K 5/00* (2006.01)
*H05K 9/00* (2006.01)
(Continued)

(52) U.S. Cl.
CPC ................ *H05K 9/00* (2013.01); *H01L 23/552* (2013.01); *H01L 21/561* (2013.01); *H01L 24/97* (2013.01); *H01L 2224/16225* (2013.01); *H01L 2224/97* (2013.01); *H01L 2924/19105* (2013.01)
USPC ............ 361/752; 361/728; 361/748; 361/816; 361/761; 174/255; 174/260; 174/384; 174/521

(58) Field of Classification Search
CPC ........ H05K 1/183; H05K 1/0224; H05K 1/05; H05K 1/053; H05K 1/056
USPC ......... 361/748, 752, 816, 761, 799, 728, 763; 174/255, 260, 384, 521
See application file for complete search history.

(56) References Cited

U.S. PATENT DOCUMENTS 7,750,247 B2 * 7/2010 Chikagawa et al. .......... 174/260
8,488,330 B2 * 7/2013 Takai ............................ 361/760
(Continued)

FOREIGN PATENT DOCUMENTS

JP 2004-063803 A 2/2004
JP 2009-004584 A 1/2009

*Primary Examiner* — David M Sinclair
*Assistant Examiner* — Robert Brown
(74) *Attorney, Agent, or Firm* — Fitch Even Tabin & Flannery LLP (57) ABSTRACT

An electronic circuit module includes a substrate with built-in component, a mount component mounted on the substrate with built-in component, a sealing portion covering the mount component, and a shield made of a conductive synthetic resin covering the sealing portion. The substrate with built-in component has a core layer made of a metal, an outer cover made of an insulating synthetic resin, and a first protrusion. The core layer has corners and side faces. The outer cover covers the corners and the side faces, and has a first surface. The first protrusion has a first end face exposed at the outer cover and a second surface adjacent to the first surface, and is formed away from the corners of the side faces to protrude outwardly. The sealing portion covers the mount component. The shield covers the sealing portion, and has a third surface bonded to the first surface and the second surface.

4 Claims, 6 Drawing Sheets

(51) Int. Cl.
*H01L 23/552* (2006.01)
*H01L 21/56* (2006.01)
*H01L 23/00* (2006.01)

(56) References Cited

U.S. PATENT DOCUMENTS

| | | | |
|---|---|---|---|
| 2003/0169575 A1* | 9/2003 | Ikuta et al. | 361/761 |
| 2004/0018373 A1* | 1/2004 | Suzuki et al. | 428/596 |
| 2007/0158101 A1* | 7/2007 | Chikagawa et al. | 174/260 |
| 2007/0273014 A1* | 11/2007 | Lee et al. | 257/686 |
| 2009/0101400 A1* | 4/2009 | Yamakoshi | 174/260 |
| 2010/0027225 A1* | 2/2010 | Yuda et al. | 361/736 |
| 2010/0149768 A1* | 6/2010 | Takaike | 361/761 |
| 2011/0155433 A1* | 6/2011 | Funaya et al. | 174/258 |
| 2012/0000699 A1* | 1/2012 | Inoue | 174/257 |
| 2012/0307459 A1* | 12/2012 | Sakuma et al. | 361/728 |
| 2013/0020119 A1* | 1/2013 | Yoshida | 174/260 |
| 2013/0206443 A1* | 8/2013 | Ooishi et al. | 174/50 |
| 2013/0294034 A1* | 11/2013 | Kanryo et al. | 361/728 |
| 2014/0049928 A1* | 2/2014 | Sawatari et al. | 361/762 |

* cited by examiner

ELECTRONIC CIRCUIT MODULE AND METHOD FOR PRODUCING THE SAME

CROSS-REFERENCE TO RELATED APPLICATIONS

This application claims priority under 35 U.S.C. §119 to Japanese Patent Application No. JP2013-192505, filed on Sep. 18, 2013, and Japanese Application No. 2012-245166, filed on Nov. 7, 2012, the entire content of which are hereby incorporated herein by reference in their entirety.

FIELD

The present disclosure relates to an electronic circuit module including a sealing portion covering a mount component mounted on a substrate with built-in component, and a shield covering the sealing portion, and a method for producing the same.

BACKGROUND

This kind of an electronic circuit module includes a substrate with built-in component, mount components mounted on the substrate with built-in component, a sealing portion covering the mount components, and a shield covering the sealing portion as shown in FIG. 3 in Japanese Patent Application Laid-open No. 2009-004584. In the electronic circuit module, predetermined electronic circuits including built-in components and mount components are three-dimensionally constructed. The shield is connected to ground wiring of the substrate with built-in component, and prevents noises from outside.

Japanese Patent Application Laid-open No. 2004-63803 discloses that in a printed wiring board including a metal board and insulating resin layers disposed on both surfaces of the metal board, the metal plate is easily cut using a dicing machine while a flatness of the insulating resin layers is enhanced by forming indentations on the both surfaces of the metal plate along lines to be cut.

In general, the shield in the electronic circuit module described in Japanese Patent Application Laid-open No. 2009-004584 is formed of a metal. If the shield is formed of a conductive synthetic resin, the following defects may be induced. In other words, a bonding force between the metal and the synthetic resin tends to be lower than that between the metals or the synthetic resins. If the shield is formed of the conductive synthetic resin, the bonding force between the shield and the ground wiring made of a metal is decreased over time, which induces a local peeling at a boundary. As a result, a conduction property between the shield and the ground wiring is decreased and a desirable shield effect is not easily obtainable.

In the printed wiring board described in Japanese Patent Application Laid-open No. 2004-63803, burrs may be generated at cutting positions corresponding to four corners of the metal plate. When the burrs are contacted with wiring layers and peripheral circuits formed on the insulating resin layer, short circuit may be induced. However, there is no description about a method for preventing the burrs from being generated in Japanese Patent Application Laid-open No. 2004-63803.

SUMMARY

In view of the above-described circumstances, it is desirable to provide an electronic circuit module and a method for producing the same that maintain successfully a desirable shield effect and prevent burrs from being generated.

According to an embodiment of the present disclosure, there is provided an electronic circuit module including a substrate with built-in component; a mount component; a sealing portion; and a shield made of a conductive synthetic resin.

The substrate with built-in component has a core layer made of a metal, an outer cover made of an insulating synthetic resin, and a first protrusion. The core layer has corners and side faces, and also functions as ground wiring. The outer cover covers the corners and the side faces, and has a first surface. The first protrusion has a first end face exposed at the outer cover and a second surface adjacent to the first surface, and is formed away from the corners of the side faces to protrude outwardly.

The mount component is mounted on the substrate with built-in component.

The sealing portion covers the mount component.

The shield covers the sealing portion, and has a third surface bonded to the first surface and the second surface.

According to an embodiment of the present disclosure, there is provided a method for producing an electronic circuit module according to an embodiment of the present disclosure, including preparing a metal plate where first concave portions are discontinuously formed on a first main surface along a plurality of parting lines intersecting each other, and apertures are formed at intersections of the plurality of parting lines, the apertures each having a depth from the first main surface to the second main surface opposite thereto.

The first concave portions and the apertures are filled with an insulating material.

On the first main surface, a first wiring substrate is laminated.

On the first wiring substrate, an electronic component is mounted.

On the first wiring substrate, a sealing layer covering the electronic component is formed.

Along the plurality of parting lines, grooves each having a depth reaching to the first main surface are formed on the sealing layer.

A conductive resin layer covering the sealing layer is formed.

Along the plurality of parting lines, the metal plate, the sealing layer and the conductive resin layer are cut.

These and other objects, features and advantages of the present disclosure will become more apparent in light of the following detailed description of best mode embodiments thereof, as illustrated in the accompanying drawings.

DETAILED DESCRIPTION OF THE EMBODIMENTS

Hereinafter, embodiments according to the present disclosure will be described with reference to the drawings.
<Structure of Electronic Circuit Module>

An electronic circuit module 10 shown in FIGS. 1 to 5 includes a substrate 11 with built-in component, mount components 12 mounted on the substrate 11 with built-in component, a sealing portion 13 covering the mount components 12 and a shield 14 covering the sealing portion 13. A predetermined electronic circuit including built-in components 11b and the mount components 12 is three-dimensionally constructed.

Figures 1, 2:
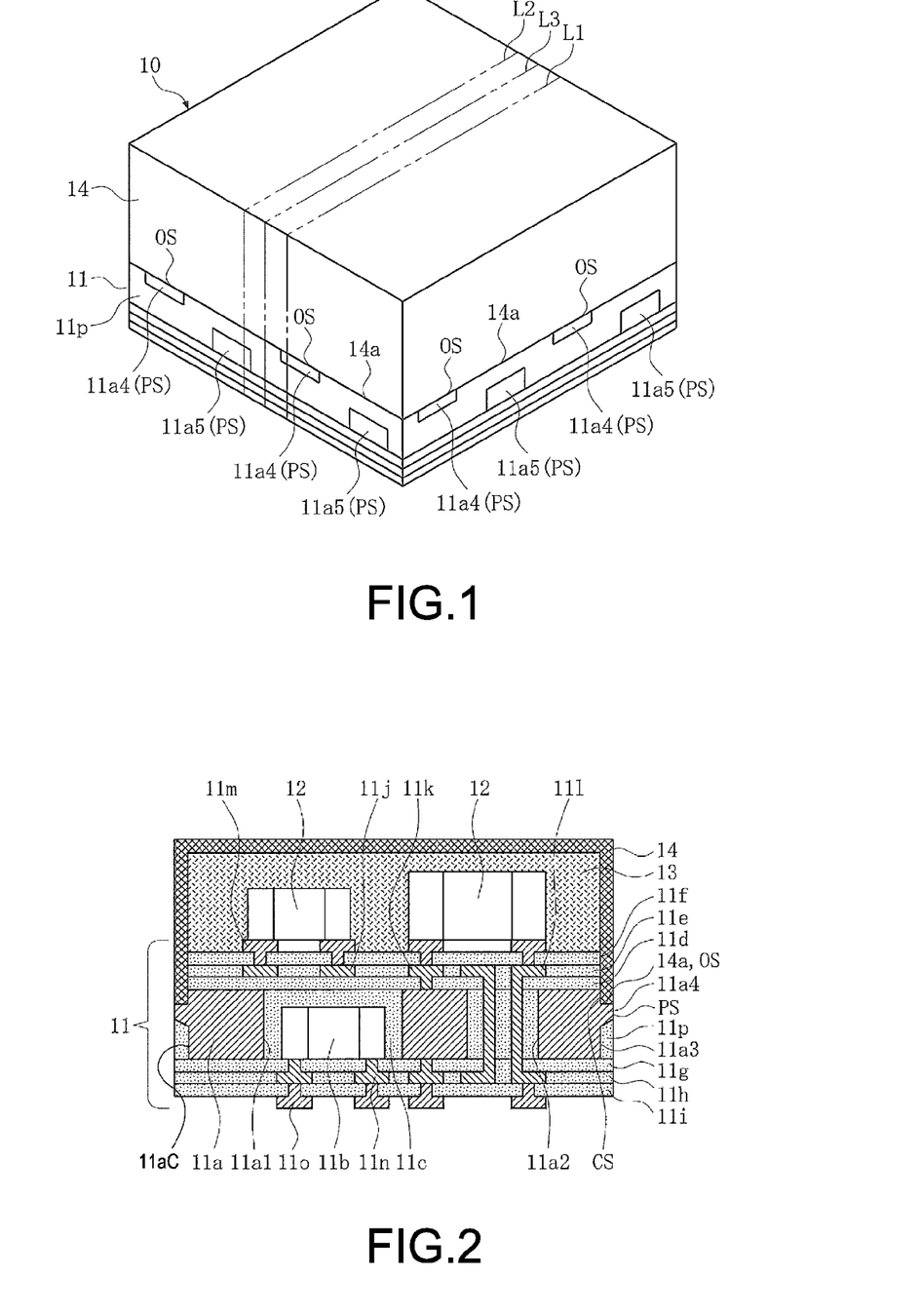
FIG. 1 is a perspective view of an electronic circuit module according to an embodiment of the present disclosure.
FIG. 2 is a longitudinal sectional view along the line L1 of FIG. 1.
Figure 3:
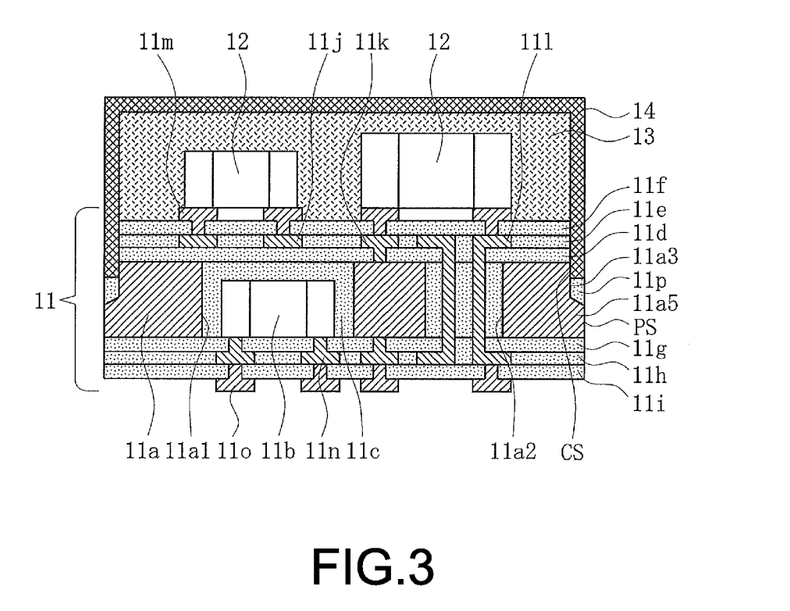
FIG. 3 is a longitudinal sectional view along the line L2 of FIG. 1.
Figure 4:
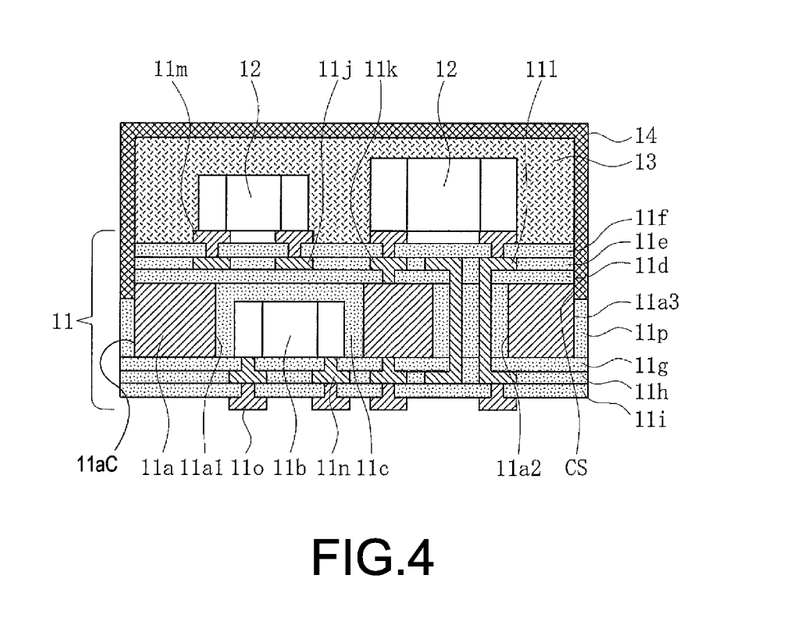
FIG. 4 is a longitudinal sectional view along the line L3 of FIG. 1.

Positions of the longitudinal sectional views shown in FIGS. 2 to 4 (see the lines L1 to the lines L3 of FIG. 1) are different. As a matter of convenience, section structures shown in FIGS. 2 to 4 are the same excluding a side of a core layer 11a as described later.

In each section structure shown in FIGS. 2 to 4, the substrate 11 with built-in component includes the core layer 11a, a built-in component 11b stored in a storage portion 11a1 disposed within the core layer 11a, and an insulation portion 11c disposed in a space between the built-in component 11b and the storage portion 11a1. The substrate 11 with built-in component includes three insulation layers 11d to 11f disposed at an upper surface (one face in a thickness direction) of the core layer 11a, and three insulation layers 11g to 11i disposed at a bottom layer (the other face in the thickness direction) of the core layer 11a. Although FIGS. 2 to 4 show the storage portion 11a1 having penetrating holes, the storage portion 11a1 having no penetrating holes may be used as long as the built-in components 11b can be stored.

The insulation layer 11e has two signal wirings 11j, and a T type conductor via 11k penetrating through the insulation layer 11d. The insulation layers 11e and 11h have an I type conductor via 11l penetrating through the insulation layer 11d, the core layer 11a and the insulation layer 11g such that the I type conductor via 11l is not contacted with the core layer 11a. At an upper surface of the insulation layer 11f, four T type conductor vias 11m are disposed penetrating through the insulation layer 11f. At the insulation layer 11h, three T type conductor vias 11n are disposed penetrating through the insulation 11g. At a lower surface of the insulation layer 11i, four T type conductor vias 11o are disposed penetrating through the insulation layers 11ih. Although no symbols are added, an insulation portion is disposed in a space between the conductor via 11l and an inner wall of a penetrating hole 11a2, and an insulation portion is also disposed in a space within the conductor via 11l.

Further, a lower surface of the conductor via 11k is connected to an upper surface of the core layer 11a, lower surfaces of the two conductor vias 11m among the four conductor vias 11m are connected to upper surfaces of two signal wirings 11j, a lower surface of one conductor via 11m among the rest two conductor vias 11m is connected to an upper surface of the conductor via 11k, and a lower surface of the rest one conductor via 11m is connected to an upper surface of the conductor via 11l. Upper surfaces of the two conductor vias 11n among the three conductor vias 11n are connected to terminals of the built-in component 11b, and an upper surface of the rest one conductor via 11n is connected to a lower surface of the core layer 11a. Upper surfaces of the two conductor vias 11o among the four conductor vias 11o are connected to lower surfaces of the two conductor vias 11n, an upper surface of one conductor via 11o among the rest two conductor vias 11o is connected to a lower surface of the one conductor via 11n, and an upper surface of the rest one conductor via 11o is connected to a lower surface of the conductor via 11l.

Although not shown in the section structures shown in FIGS. 2 to 4, the substrate 11 with built-in component includes signal wirings and conductor vias other than those described above, and also includes the ground wiring other than the core layer 11a.

The core layer 11a is made of a metal such as copper and a copper alloy, has a thickness, for example, of 35 to 500 μm, and also functions as the ground wiring. The built-in component 11b is an electronic component such as a capacitor, an inductor, a resistor, a filter chip and an IC chip. In FIGS. 2 to 4, one built-in component 11b is shown, but the number of the built-in component 11b is not especially limited.

Each of the insulation layers 11d to 11f and 11g to 11i is made of an insulating thermosetting synthetic resin including an epoxy resin, polyimide, a bismaleimide triazine resin or the above-described resin containing a reinforcing filler such as glass fiber, and has a thickness, for example, of 5 to 50 μm. Also, the insulation portion 11c, the insulation portion (no symbol) disposed in the space between the conductor via 11l and an inner wall of the penetrating hole 11a2, and the insulation portion (no symbol) disposed in the space within the conductor via 11l are made of an insulating thermosetting synthetic resin including an epoxy resin, polyimide, a bismaleimide triazine resin or the above-described resin containing a reinforcing filler such as glass fiber.

Here, referring to FIGS. 1 and 5, a structure of side faces of the core layer 11a will be described in detail.

The core layer 11a has a substantially rectangular shape at an upper contour, and has four corners 11aC and four side faces 11a3. The core layer 11a has first protrusions 11a4 and second protrusions 11a5 that protrude outwardly from four side faces 11a3. Two first protrusions 11a4 and two second protrusions 11a5 are integrally formed on the respective side faces 11a3.

The first protrusions 11a4 are positioned at an upper side of the core layer 11a in a thickness direction, and the second protrusions 11a5 are positioned at lower side of the core layer 11a in the thickness direction. The first protrusions 11a4 and the second protrusions 11a5 are arranged alternately staggered in the respective side faces 11a3 at spaces CL in a direction orthogonal to the thickness direction of the core layer 11a.

The first protrusions 11a4 and the second protrusions 11a5 are rectangular parallelepiped. A width W11a4 of the first protrusion 11a4 and a width W11a5 of the second protrusion 11a5 are almost same, and are within a range of 200 to 600 μm, for example. The space CL therebetween is also within a range of 200 to 600 μm, for example. A height H11a4 of the first protrusion 11a4 is lower than a height H11a5 of the second protrusion 11a5, the height H11a4 of the first protrusion 11a4 is within a range of 50 to 200 μm, for example, and the height H11a5 of the second protrusion 11a5 is within a range of 100 to 300 μm, for example.

A protruded dimension P11a4 of the first protrusion 11a4 and a protruded dimension P11a5 of the second protrusion 11a5 are almost same, and are within a range of 50 to 200 μm, for example. End faces PS of the both are almost in parallel with the side faces 11a3 of the core layer 11a, and are almost in plane with respective end faces of the insulation layers 11g to 11i (see FIGS. 2 and 3).

Figure 5:
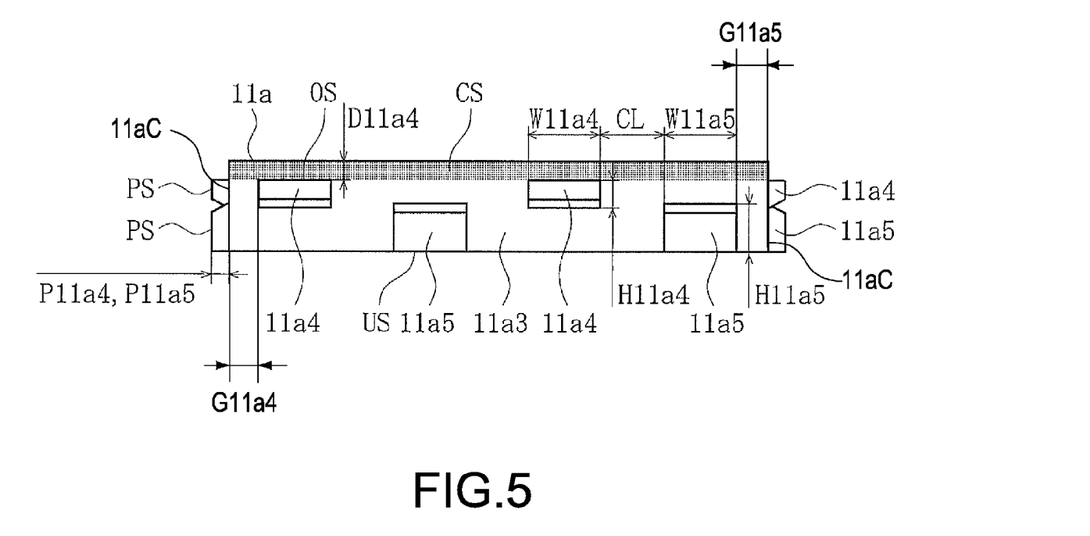
FIG. 5 is a sectional view of a core layer shown in FIGS. 2 to 4.

As shown in FIGS. 2 and 5, each face OS of each first protrusion 11a4 facing to an end face 14a of the shield 14 is almost in parallel with the upper surface of the core layer 11a, and a distance D11a4 therebetween is, for example, 50 to 200 μm. At an upper surface of each side face 11a3, a strip-like side face zone CS (see a hatched zone, and FIGS. 2 to 4) corresponding to the distance D11a4 is disposed. A lower surface US of each second protrusion 11a5 is almost in plane with the lower surface of the core layer 11a.

The outer cover 11p covers the respective side faces 11a3 and the corners 11aC of the core layer 11a. According to the present disclosure, areas excluding the side face zone CS at each side face 11a3 of the core layer 11a, the first protrusions 11a4 and the second protrusions 11a5 are covered with an outer cover 11p (see FIGS. 2 to 4). The outer cover 11p is made of an insulating thermosetting synthetic resin including an epoxy resin, polyimide, a bismaleimide triazine resin or the above-described resin containing a reinforcing filler such as glass fiber. A thickness of the outer cover 11p is almost same as the protruded dimension P11a4 of the first protrusion 11a4 and the protruded dimension P11a5 of the second protrusion 11a5, and has a thickness, for example, of 50 to 200 μm. End faces PS (first end faces) of the first protrusion 11a4 and end faces PS (second end faces) of the second protrusion 11a5 are exposed at each side face of the outer cover 11p (see FIGS. 2 and 3).

In addition, each face OS (the second surface) of each first protrusion 11a4 facing to the end face 14a (the third surface) of the shield 14 is almost in plane with each face OS (the first surface) of the outer cover 11p facing to the end face 14a of the shield 14. Also, each face OS (the second surface) of each first protrusion 11a4 facing to the end face 14a (the third surface) of the shield 14 is adjacent to each face OS (the first surface) of the outer cover 11p facing to the end face 14a (the third surface) of the shield 14. In other words, the end face 14a (the third surface) of the shield 14 is bonded to both of each face OS (the second surface) of each first protrusion 11a4 facing to the end face 14a of the shield 14 and each face OS (the first surface) of the outer cover 11p facing to the end face 14a of the shield 14, and an end inner face (no symbol) is bonded to the side face zone CS of the core layer 11a (see FIGS. 2 to 4). In contrast, as a position of each second protrusion 11a5 is lower than a position of each first protrusion 11a4, the shield 14 is not bonded to each second protrusion 11a5.

Each first protrusion 11a4 is disposed away from each corner 11aC of each side face 11a3 of the core layer 11a. Each second protrusion 11a5 is disposed away from each corner 11aC of each side face 11a3 of the core layer 11a.

As shown in FIG. 5, the first protrusion 11a4 most adjacent to the corner 11aC is disposed at the side face 11a3 between the corner 11aC and the first protrusion 11a4 in a space G11a4. On the other hand, the second protrusion 11a5 most adjacent to the corner 11aC is disposed at the side face 11a3 between the corner 11aC and the second protrusion 11a5 in a space G11a5. Although the space G11a4 and the space G11a5 are formed almost equally, it should be appreciated that the disclosure is not limited thereto.

In each section structure shown in FIGS. 2 to 4, each mount components 12 is an electronic component such as a capacitor, an inductor, a resistor, a filter chip and an IC chip. One terminal of the mount component 12 is connected to the upper surface of the two conductor vias 11m among the four conductor vias 11m, and the other terminal of the mount component 12 is connected to the upper surface of the rest two conductor vias 11m. In order to connect each mount component 12 to the conductor via 11m, soldering such as a reflow method is utilized. Although two mount components 12 are shown in FIGS. 2 to 4, the number of the mount components 12 is not especially limited.

In each section structure shown in FIGS. 2 to 4, the sealing portion 13 is disposed at the upper surface of the substrate 11 with built-in component such that the sealing portion 13 covers the mount components 12. The sealing portion 13 is rectangular parallelepiped in appearance, and each side face is almost in plane with each end face of the insulation layers 11d to 11f. The sealing portion 13 is made of an insulating thermosetting synthetic resin including an epoxy resin, polyimide, a bismaleimide triazine resin or the above-described resin containing a reinforcing filler such as glass fiber, and its height is set such that the mount components 12 are fully covered.

In each section structure shown in FIGS. 2 to 4, the shield 14 is disposed such that the shield 14 covers the surface of the sealing portion 13 and side face zone CS of the core layer 11a of the substrate 11 with built-in component (see FIGS. 2 to 5). The shield 14 is rectangular parallelepiped in appearance (see FIG. 1), and each side face is almost in plane with each side face of the outer cover 11p and each end face of the insulation layers 11g to 11i. The shield 14 is made of a conductive thermosetting synthetic resin including an epoxy resin containing the conductive filler such as metal fibers, polyimide containing the conductive filler, a bismaleimide triazine resin containing the conductive filler, and has a thickness, for example, of 50 to 200 μm. The shield 14 is bonded to the core layer 11a, each first protrusion 11a4 and the outer cover 11p, as described above.

[Method for Producing Electronic Circuit Module]

Figure 6A:
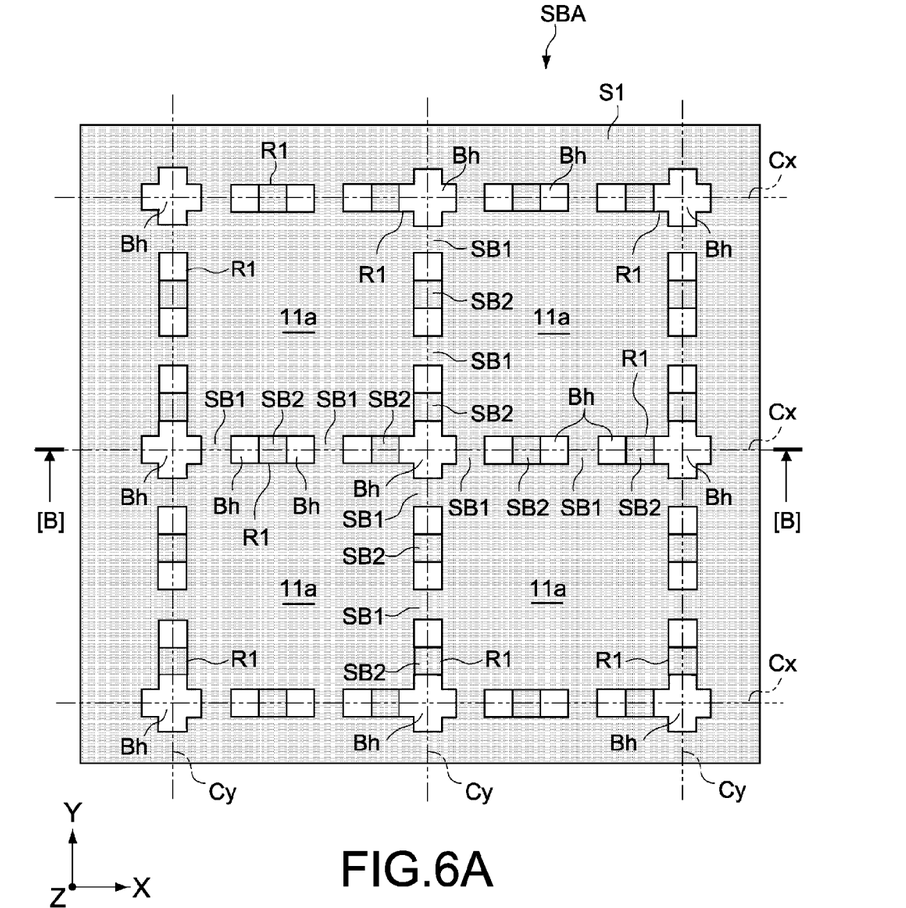
FIG. 6A is a schematic plan view showing a configuration of a metal plate used in the method for producing the electronic circuit module.
Figure 6B:
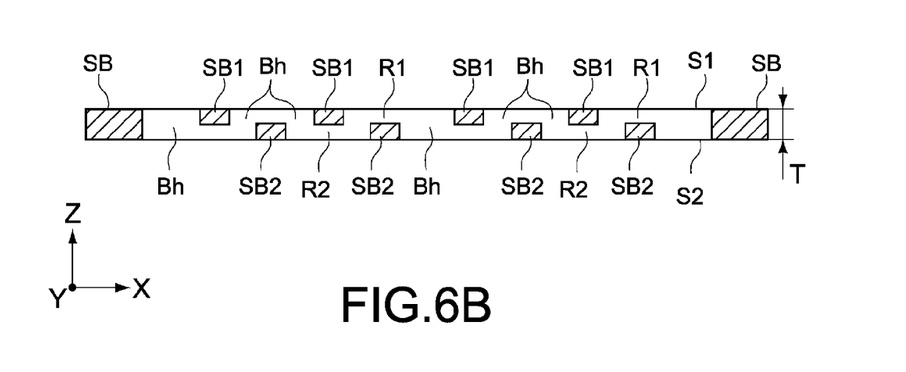
FIG. 6B is a sectional view of FIG. 6A along the line [B]-[B]

When the electronic circuit module 10 is produced, a metal plate SBa where a plurality of the core layers 11a are connected in a matrix is prepared, as shown in FIGS. 6A and 6B. FIG. 6A is a plan view of the metal plate SBa, and FIG. 6B is a sectional view of FIG. 6A along the line [B]-[B].

In FIG. 6A, the storage portion 11a1, the penetrating hole 11a2 or the like is not shown. Although the metal plate SBa shown is configured to have a size where four core layers 11a are taken by cutting along the parting lines Cx and Cy, it is not limited thereto. Also, the metal plate SBa may be formed to have a size where more core layers 11a may be taken. The parting lines Cx and Cy may be virtual, or may be actually drawn on the metal plate SBa by printing or the like.

The metal plate SBa has a surface S1 (the first main surface) and a rear surface S2 (the second main surface). The surface S1 forms the surface of the core layer 11a on which the insulation layer 11d is formed, and the surface S2 forms the surface of the core layer 11g on which the insulation layer 11g is formed.

On the surface S1 of the metal plate SBa, the first concave portions R1 are discontinuously formed along the plurality of parting lines Cx and Cy. The first concave portions R1 are formed in an almost rectangular shape having longitudinal directions in extensional directions of the parting lines Cs and Cy, and have depths corresponding to about ½ of a thickness T of the metal plate SBa. The first concave portions R1 are formed such that they are partly overlapped at intersections of the parting lines Cx and Cy.

On the other hand, on the rear surface S2 of the metal plate SBa, the second concave portions R2 are discontinuously formed along the plurality of parting lines Cx and Cy. The second concave portions R2 are formed across two first concave portions R1 adjacent, as shown in FIG. 6B. The second concave portions R2 are formed in an almost rectangular shape having longitudinal directions in the extensional directions of the parting lines Cs and Cy, and have depths corresponding to about ½ of a thickness T of the metal plate SBa. The second concave portions R2 are formed such that they are partly overlapped at intersections of the parting lines Cx and Cy.

The first concave portions R1 and the second concave portions R2 are formed by half-etching the metal plate SBa using a wet etching method, for example. The first concave portions R1 and the second concave portions R2 may be formed individually or simultaneously.

In the metal plate SBa, first connection portions SB1, second connection portions SB2 and apertures Bh are formed on the parting lines Cx and Cy by the first concave portions R1 and the second concave portions R2.

The first connection portions SB1 and the second connection portions SB2 configure the first protrusions 11a4 and the second protrusions 11a5 formed to protrude outwardly from the side faces of the core layer 11a when the metal plate SBa is cut, for example, by a dicer along the parting lines Cx and Cy.

The apertures Bh are formed at areas where the first concave portions R1 and the second concave portions R2 are overwrapped each other viewing from the thickness direction of the metal plate SBa. The apertures Bh are configured of penetrating holes formed in a thickness from the surface S1 to the rear surface S2 of the metal plate SBa.

The apertures Bh are formed between the first connection portions SB1 and the second connection portions SB2 and at intersections of the parting lines Cx and Cy. The apertures Bh are formed to have a rectangular planar shape between the first connection portions SB1 and the second connection portions SB2. On the other hand, the apertures Bh are formed to have a cross planar shape at the intersections of the parting lines Cx and Cy. A size of each aperture Bh may be enough to provide the spaces G11a4 and G11a5 between the corner 11aC and the first protrusion 11a4 and the second protrusion 11a5 after cutting.

Figure 7A:
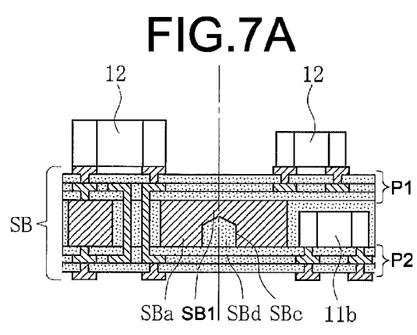
FIGS. 7A to 7C each is a view illustrating a method for producing the electronic circuit module.
Figure 7B:
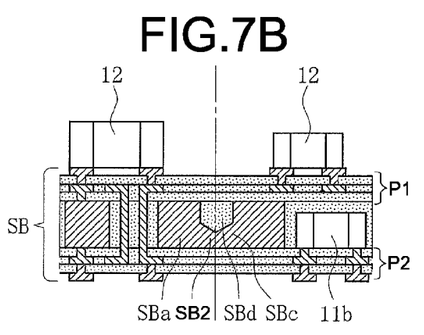
Figure 7C:
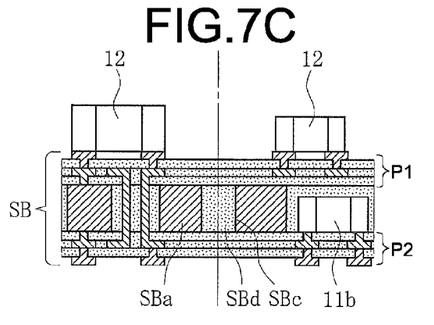

Then, as shown in FIG. 7A, FIG. 7B and FIG. 7C, the aggregate substrate SB having the plurality of substrates with built-in component 11 connected in a matrix is prepared, for example. FIG. 7A is a major portion longitudinal sectional view of the aggregate substrate SB corresponding to the sectional structure shown in FIG. 2. FIG. 7B is a major portion longitudinal sectional view of the aggregate substrate SB corresponding to the sectional structure shown in FIG. 3. FIG. 7C is a major portion longitudinal sectional view of the aggregate substrate SB corresponding to the sectional structure shown in FIG. 4.

As shown in FIGS. 7A to 7C, the aggregate substrate SB is produced by the steps of filling the first and second concave portions R1 and R2 of the metal plate SBa and the apertures Bh are filled with an insulating material SBd, laminating first and second wiring substrates P1 and P2 on the surface S1 and the rear surface S2 of the metal plate SBa, and mounting mount components 12 on the first wiring substrate P1.

In the metal plate SBa as the core layer, there are a first connection portion SB1 (see FIG. 7A) that is cut and forms the two first protrusions 11a4 shown in FIG. 2 and a second connection portion SB2 (see FIG. 7B) that is cut and forms the two second protrusions 11a5 shown in FIG. 3. The built-in component 11b is stored in a cavity corresponding to the storage portion 11a1 of the metal plate SBa, and the cavity is filled with the insulating material corresponding to the insulation portion 11c.

At a lower side of the first connection portion SB1 shown in FIG. 7A, there is a concave portion (corresponds to the second concave portion R2) including an inner face SBc corresponding to the side face 11a3. At an upper side of the second connection portion SB2 shown in FIG. 7B, there is a concave portion (corresponds to the first concave portion R1) including an inner face SBc corresponding to the side face 11a3. Both concave portions are filled with the insulating material SBd corresponding to the outer cover 11p. There are no connection portions SB1 and SB2b in FIG. 7C, the inner face SBc (corresponds to the apertures Bh) corresponding to the side face 11a3 is filled with the insulating material SBd corresponding to the outer cover 11p. Then, the mount components 12 are mounted on the aggregate substrate SB by a reflow solder method.

Next, the electronic circuit module 10 is produced by steps of forming the sealing layer (the sealing portion 13) covering the mount components 12 on the first wiring substrate P1, forming the grooves each having the depth reaching to the surface S1 of the metal plate SBa on the sealing layer along the plurality of parting lines Cx and Cy, forming the conductive resin layer (the shield 14) covering the sealing layer, and cutting the metal plate SBa, the sealing layer and the conductive resin layer along the plurality of parting lines Cx and Cy.

Figure 8A:
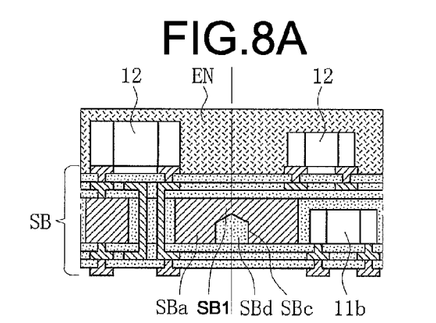
FIGS. 8A to 8H each is a view illustrating a method for producing the electronic circuit module.
Figure 8B:
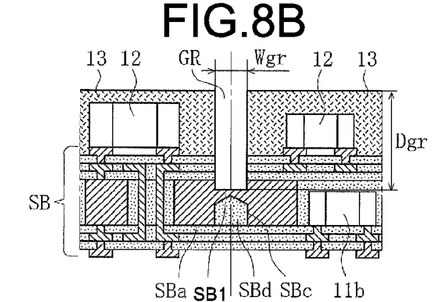
Figure 8C:
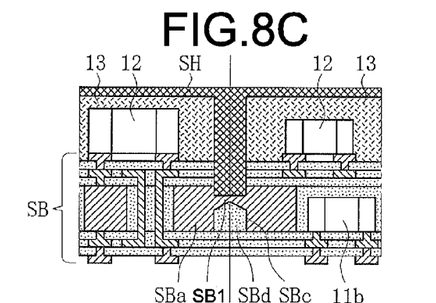
Figure 8D:
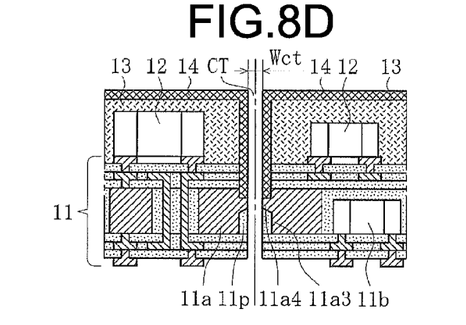
Figure 8E:
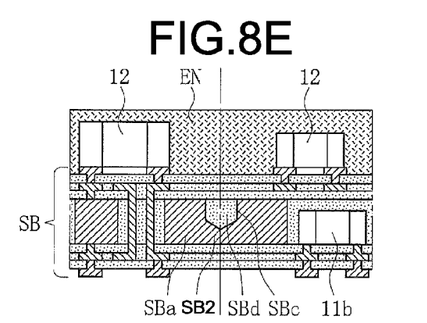
Figure 8F:
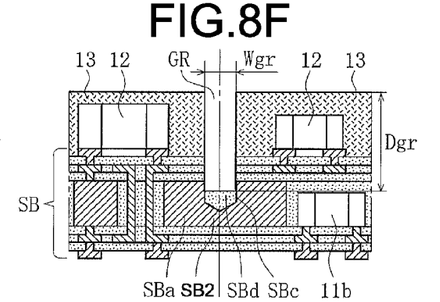

As shown in FIGS. 8A and 8E, the sealing material EN corresponding to the sealing portion 13 is coated and cured on the upper surface of the aggregate substrate SB to cover the mount components 12. Then, as shown in FIGS. 8B and 8F, a slit GR is formed from top to bottom at a boundary (see the parting lines Cx and Cy and a dashed-dotted line) of each substrate 11 with built-in component using a dicing machine etc. A width Wgr of the slit GR substantially corresponds to a facing space of the inner face SBc corresponding to the side face 11a3, and a depth Dgr is such that the slit GR enters into an upper surface of the connection potion SB1. In this way, the sealing portion 13 for each substrate 11 with built-in component is produced.

Figure 8G:
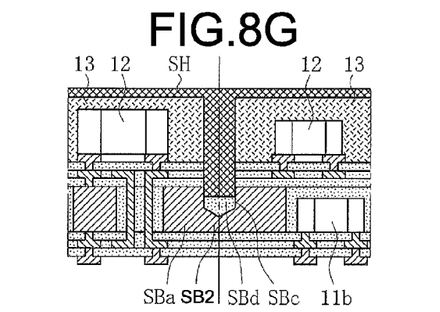
Figure 8H:
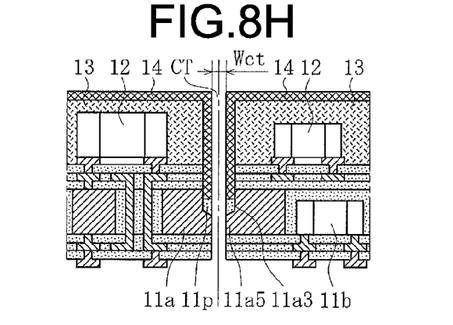

Next, as shown in FIGS. 8C and 8G, a shielding material SH (the conductive resin) corresponding to the shield 14 is coated and cured so that the sealing portion 13 of the aggregate substrate SB is covered and the slit GR is filled therewith. Then, as shown in FIGS. 8D and 8H, each substrate 11 with built-in component is cut at the boundary (see the parting lines Cx and Cy and the dashed-dotted line) using a dicing machine etc. As a width Wct of a cut mark CT is smaller than a width Wgr of the slit GR, the first protrusions 11a4, the second protrusions 11a5 and the outer cover 11p remain on each substrate 11 with built-in component. Also, as a part of the first connection portion SB1 is cut upon the formation of the slit GR, cutting can be easily done as compared with the case that a part of the connection portion SB1 is not cut.

<Actions of Electronic Circuit Module>

(1) The circuit module 10 according to the present embodiment includes the substrate 11 with built-in component including the core layer 11a made of a metal also functioning as the ground wiring, the outer cover 11p made of the insulating synthetic resin covering the side face 11a3 of the core layer 11a, and the two first protrusions 11a4 that protrude outwardly from each side face 11a3 of the core layer 11a and have the end faces PS integral with the core layer 11a exposed at the outer cover 11p. Further, the circuit module 10 has a configuration that each face OS of each first protrusion 11a4 facing to the end face 14a of the shield 14 is adjacent to each face OS of the outer cover 11p facing to the end face 14a of the shield 14, and the end face 14a of the shield 14 is bonded to both of the each face OS of each first protrusion 11a4 facing to the end face 14a of the shield 14 and each face OS of the outer cover 11p facing to the end face 14a of the shield 14.

In other words, the end face 14a of the shield 14 can be bonded to each face OS of the outer cover 11p made of the insulating synthetic resin facing to the end face 14a of the shield 14 with a strong bonding force by bonding of the synthetic resins, even when the shield 14 is made of the conductive synthetic resin. Also, based on this bonding, bonding of the end face 14a of the shield 14 and the face OS of each first protrusion 11a4 made of a metal facing to the end face 14a of the shield 14 can be successfully maintained. In summary, the bonding of the shield 14 to each first protrusion 11a4 made of a metal is not easily degraded as time elapses, even when the shield 14 is made of the conductive synthetic resin. In this way, a decrease in conductivity between the shield 14 and each first protrusion 11a4 made of a metal is certainly avoided to successfully maintain a desirable shielding effect.

In addition, the two first protrusions 11a4 are disposed at the side faces 11a3 of the core layer 11a. In this way, the end face 14a of the shield 14 and each face OS of each first protrusion 11a4 made of a metal facing to the end face 14a of the shield 14 can be bonded successfully, and a bond area is increased to enhance the conductivity between the shield 14 and each first protrusion 11a4 made of a metal.

Also, as each end face PS of each first protrusion 11a4 is exposed at the outer cover 11p, each end face PS of each first protrusion 11a4 can be used as the ground terminal.

(2) The circuit module 10 has the distance D11a4 between each face OS of each first protrusion 11a4 facing to an end face 14a of the shield 14 and one face in a thickness direction of the core layer 11a, and the side face zone CS corresponding to the distance D11a4 is disposed at each side face 11a3 of the core layer 11a. The circuit module 10 has a configuration that the end face 14a of the shield 14 is bonded to both of each face OS of each first protrusion 11a4 facing to the end face 14a of the shield 14 and each face OS of the outer cover 11p facing to the end face 14a of the shield 14, and the end inner face is bonded to the side face zone CS.

In other words, the end face 14a of the shield 14 can be bonded to the face OS of the outer cover 11p made of the insulating synthetic resin facing to the end face 14a of the shield 14 with a strong bonding force by bonding of the synthetic resins, even when the shield 14 is made of the conductive synthetic resin. Also, based on this bonding, bonding of the end face 14a of the shield 14 and the face OS of each first protrusion 11a4 made of a metal facing to the end face 14a of the shield 14, and bonding of the end inner face of the shield 14 and the side face zone CS can be successfully maintained. In summary, the bonding of the shield 14 to each first protrusion 11a4 made of a metal and the side face zone CS is not easily degraded as time elapses combining with an increase in the bond area, even when the shield 14 is made of the conductive synthetic resin. In this way, a decrease in conductivity between the shield 14 and each first protrusion 11a4 made of a metal is avoided to successfully maintain a desirable shielding effect.

(3) The core layer 11a integrally has the two second protrusions 11a5 that protrude outwardly from each side faces 11a3, and each end face PS thereof is exposed at the outer cover 11p. The circuit module 10 has a configuration that the positions of the second protrusions 11a5 in the thickness direction of the core layer 11a are different from the positions of the first protrusions 11a4 in the thickness direction of the core layer 11a, and the shield 14 is not bonded to each second protrusion 11a5.

In other words, the bonding force between each side face 11a3 of the core layer 11a and the outer cover 11p made of the insulating synthetic resin can be enhanced based on the bonding of the outer cover 11p and each second protrusion 11a5. Thus, the bonding force between the outer cover 11p and the each side face 11a3 of the core layer 11a is prevented from decreasing to avoid possible peeling, even when the outer cover 11p is made of the insulating synthetic resin.

In addition, as the two second protrusions 11a5 are disposed at each side face 11a3 of the core layer 11a, the bonding force is successfully increased by the second protrusions 11a5, and the bonding force between the outer cover 11p and the each side face 11a3 of the core layer 11a can be more certainly prevented from decreasing.

Also, as each end face PS of each second protrusion 11a5 is exposed at the outer cover 11p, each end face PS of each second protrusion 11a5 can be used as the ground terminal.

(4) In the electronic circuit module 10, each of the first protrusions 11a4 and the second protrusions 11a5 is formed away from each corner 11aC of each side face 11a3 of the core layer 11a to protrude outwardly. The outer cover 11p also covers the corners 11aC of the core layer 11a.

In other words, the bonding force between each side face 11a3 of the core layer 11a and the outer cover 11p made of the insulating synthetic resin can be enhanced based on the bonding of the outer cover 11p and each corner 11aC of the core layer 11a. Thus, the bonding force between the outer cover 11p and the each side face 11a3 of the core layer 11a is prevented from decreasing to avoid possible peeling, even when the outer cover 11p is made of the insulating synthetic resin.

(5) Furthermore, the electronic circuit module 10 uses the metal plate SBa where the first and second concave portions R1 and R2 are discontinuously formed on the surface S1 and the rear surface S2 along the plurality of parting lines Cx and Cy when the core layer 11a is produced, and the apertures Bh are formed at intersections of the parting lines Cx and Cy.

Accordingly, in the step of cutting the metal plate SBa, the first and second concave portions R1 and R2 are formed, thereby partly thinning the areas corresponding to the parting lines Cx and Cy. As a result, the metal plate SBa will be easily cut using a dicing machine.

In addition, the intersections of the parting lines Cx and Cy are opened by the apertures Bh. Therefore, the burrs can be prevented from generating at cut sites corresponding to the four corners (corners 11aC) of the core layer 11a. When the burrs are contacted with wiring layers and peripheral circuits of the electronic circuit module 10, short circuit may be induced. According to the present embodiment, the short circuit caused by the blurs can be prevented and debarring will be unnecessary, thereby improving productivity of the electronic circuit module 10.

While the embodiments of the present disclosure are described, it should be appreciated that the disclosure is not limited to the above-described embodiments, and variations and modifications may be made without departing from the spirit and scope of the present disclosure.

(Alternative Embodiment 1)

In the above-mentioned embodiments, the two first protrusions 11a4 and the two second protrusions 11a5 are disposed at each side face 11a3 of the core layer 11a. However, the total number of the first protrusions 11a4 and the second protrusions 11a5 may be 2, 3, or 5 or more. Even when the number of the first protrusions 11a4 and the second protrusions 11a5 disposed at each side face 11a3 is not the same or the first protrusions 11a4 and the second protrusions 11a5 are not arranged alternately, the actions (1) to (5) can be similarly provided. Also, although the core layer 11a has a substantially rectangular shape at the upper contour, the actions (1) to (5) can be similarly provided as long as the core layer 11a has similar the first protrusions 11a4 and the second protrusions 11a5, even when the upper contour has other shapes.

(Alternative Embodiment 2)

In the above-mentioned embodiments, the two first protrusions 11a4 and the two second protrusions 11a5 are disposed at each side face 11a3 of the core layer 11a. However, the actions (1), (2), (4) and (5) can be similarly provided even when the second protrusions 11a5 are removed from each side face 11a3, the total number of the first protrusions 11a4 is changed, or the upper contour of the core layer 11a is changed.

(Alternative Embodiment 3)

In the above-mentioned embodiments, the side face zone CS is disposed at each side face 11a3 of the core layer 11a. However, the actions (1), (3) to (5) can be similarly provided even when the side face zone CS is excluded and each face of each first protrusion 11a4 facing to the end face 14a of the shield 14 is in plane with the face in a thickness direction of the core layer 11a, the total number of the first protrusions 11a4 is changed, or the upper contour of the core layer 11a is changed.

(Alternative Embodiment 4)

In the above-mentioned embodiments, three insulation layers (no symbols are added) are disposed at the upper surface (one face in a thickness direction) of the core layer 11a and three insulation layers (no symbols are added) of the core layer 11a are disposed at the bottom layer (the other face in the thickness direction) of the core layer 11a. However, the actions (1) to (5) can be similarly provided even when the number of the insulation layers is changed, or the number of the built-in component 11b and the mount components 12 is changed, i.e., the electronic circuit three-dimensionally constructed is changed as appropriate.

(Alternative Embodiment 5)

In the above-mentioned embodiments, the second concave portions R2 are formed on the rear surface S2 of the metal plate SBa. However, even when no second concave portions R2 are formed, the actions (1) to (5) can be similarly provided.

What is claimed is:

1. An electronic circuit module, comprising:
a substrate with built-in component having:
a core layer made of a metal having a storage portion storing a built-in component, corners and side faces and also functioning as ground wiring;
an outer cover made of an insulating synthetic resin covering the corners and the side faces and having a first surface; and
a first protrusion made of the metal having a first end face exposed at the outer cover and a second surface adjacent to the first surface, the first protrusion being formed away from the corners of the side faces to protrude outwardly;
a mount component mounted on the substrate with built-in component;
a sealing portion covering the mount component; and
a shield made of a conductive synthetic resin covering the sealing portion having a third surface bonded to the first surface and the second surface.

2. The electronic circuit module according to claim 1, wherein
the first protrusion includes a plurality of protrusions disposed on the side faces at a same height position in a thickness direction of the core layer.

3. An electronic circuit module, comprising:
a substrate with built-in component having a core layer made of a metal having corners and side faces and also functioning as ground wiring, an outer cover made of an insulating synthetic resin covering the corners and the side faces and having a first surface, and a first protrusion having a first end face exposed at the outer cover and a second surface adjacent to the first surface, the first protrusion being formed away from the corners of the side faces to protrude outwardly;
a mount component mounted on the substrate with built-in component;
a sealing portion covering the mount component; and
a shield made of a conductive synthetic resin covering the sealing portion having a third surface bonded to the first surface and the second surface, wherein
the substrate with built-in component further has a second protrusion that protrudes outwardly from the side faces and having a second end face exposed at the outer cover,
the second protrusion is disposed away from the corners at a height position different from a position of the first protrusion in a thickness direction of the core layer.

4. The electronic circuit module according to claim 3, wherein
the second protrusion includes a plurality of protrusions disposed on the side faces at a same height position in a thickness direction of the core layer.

* * * * *